United States Patent
Dankowski et al.

(10) Patent No.: US 6,876,217 B2
(45) Date of Patent: Apr. 5, 2005

(54) METHOD FOR TESTING SEMICONDUCTOR CIRCUIT DEVICES

(75) Inventors: Stefan Dankowski, Haar-Ottendichl (DE); Alexander Benedix, München (DE); Reinhard Düregger, Poing (DE); Wolfgang Ruf, Friedberg (DE)

(73) Assignee: Infineon Technologies AG, Munich (DE)

( * ) Notice: Subject to any disclaimer, the term of this patent is extended or adjusted under 35 U.S.C. 154(b) by 59 days.

(21) Appl. No.: 10/272,344

(22) Filed: Oct. 15, 2002

(65) Prior Publication Data

US 2003/0071649 A1 Apr. 17, 2003

(30) Foreign Application Priority Data

Oct. 12, 2001 (DE) .......................................... 101 50 441

(51) Int. Cl.⁷ .............................................. G01R 31/26
(52) U.S. Cl. ....................................................... 324/763
(58) Field of Search ................................. 324/763, 765, 324/73.1; 365/200–201

(56) References Cited

U.S. PATENT DOCUMENTS

| | | | | |
|---|---|---|---|---|
| 5,794,175 A | * | 8/1998 | Conner | 324/73.1 |
| 6,233,184 B1 | | 5/2001 | Barth et al. | |
| 6,470,485 B1 | * | 10/2002 | Cote et al. | 324/613 |
| 6,661,718 B2 | * | 12/2003 | Ohlhoff et al. | 324/73.1 |

* cited by examiner

Primary Examiner—David Zarneke
Assistant Examiner—Jermele Hollington
(74) Attorney, Agent, or Firm—Laurence A. Greenberg; Werner H. Stemer; Gregory L. Mayback

(57) ABSTRACT

To be able to test a plurality of identical semiconductor circuit devices in a particularly rapid yet reliable manner, a test method includes carrying out the tests in parallel and substantially simultaneously on the plurality of semiconductor circuit devices and driver lines—used in the process—of a test device to the semiconductor circuit devices simultaneously and jointly for all the semiconductor circuit devices. In such a case, test results are read from a plurality of input/output channels in compressed form. Furthermore, as an alternative or in addition thereto, the semiconductor circuit devices to be tested are disposed and connected up in at least one stack.

38 Claims, 3 Drawing Sheets

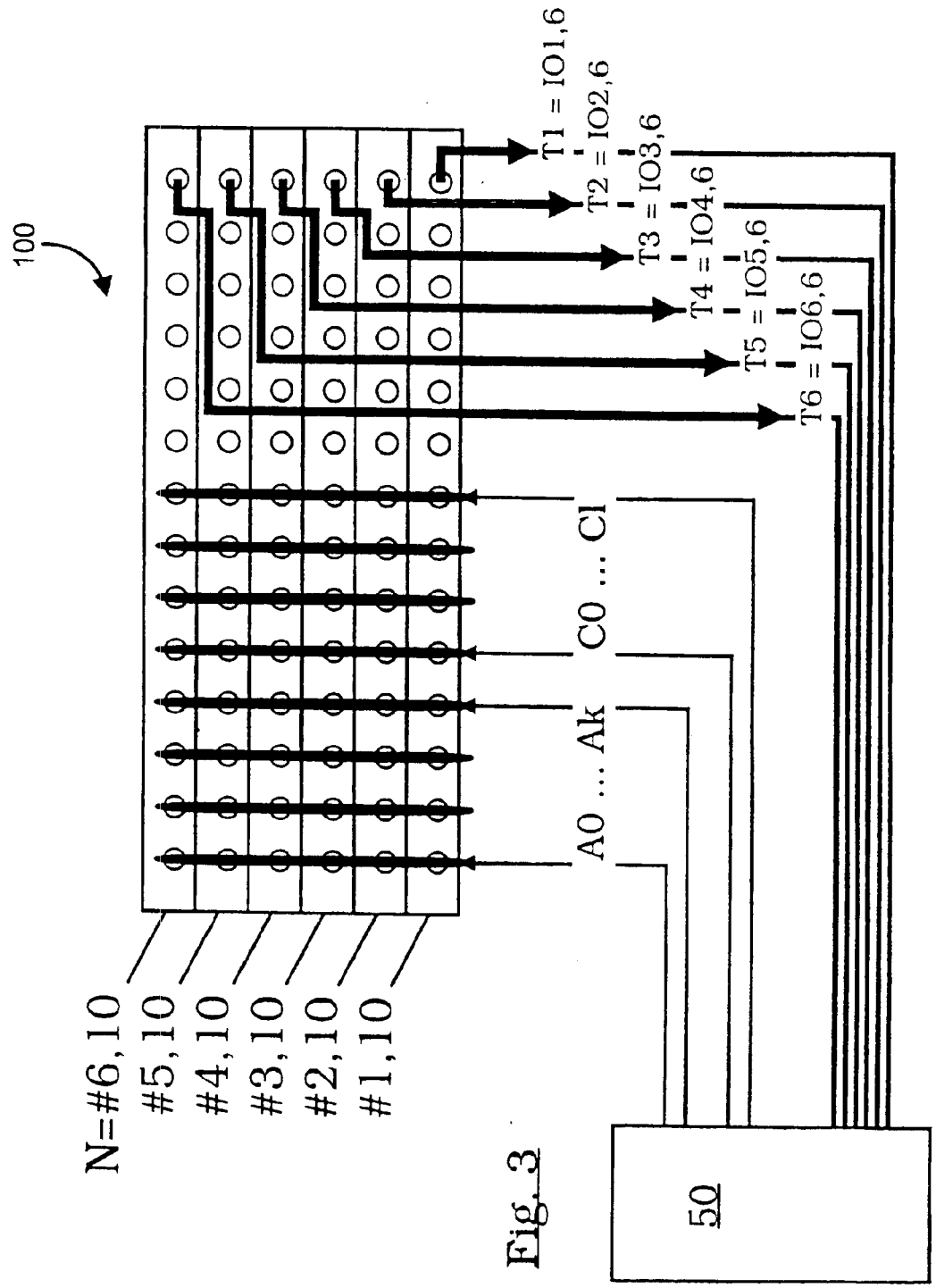

METHOD FOR TESTING SEMICONDUCTOR CIRCUIT DEVICES

BACKGROUND OF THE INVENTION

Field of the Invention

The invention relates to a method for testing semiconductor circuit devices.

In the production of semiconductor circuit devices, in particular, semiconductor memories, a considerable effort is implemented in the testing of the already completed semiconductor circuit devices in order to separate out defective, that is to say, in principle, non-functional, semiconductor circuit devices and/or to be able to carry out a classification of the fabricated and, in principle, functional semiconductor circuit devices according to specific specifications.

The complexity and the time to be spent for the tests to be carried out increase concomitantly with the complexity of the fabricated semiconductor circuit device. Nevertheless, to be able to obtain reasonable throughputs in mass production, it is necessary, therefore, to optimize the test methods.

To that end, it has been customary, hitherto, to provide apparatuses and methods for testing in which a plurality of semiconductor circuit devices to be tested can be tested in parallel and substantially simultaneously so that a plurality of semiconductor circuit devices are assessed and tested in a single test pass.

It has been shown, however, that, due to the further increasing integration density and complexity of modern semiconductor circuit devices, the basic conception of parallel testing is insufficient for realizing a corresponding test throughput.

SUMMARY OF THE INVENTION

It is accordingly an object of the invention to provide a method for testing semiconductor circuit devices that overcomes the hereinafore-mentioned disadvantages of the heretofore-known devices and methods of this general type and that permits testing of a plurality of semiconductor circuit devices reliably in a particularly simple and rapid manner.

With the foregoing and other objects in view, there is provided, in accordance with the invention, a method for testing semiconductor circuit devices, including the steps of providing a plurality of semiconductor circuit devices having a plurality of input/output line devices and driver lines, the circuit devices one of acting substantially identically and being identical, providing a test device for testing the circuit devices, carrying out at least one test on the circuit devices in parallel and substantially simultaneously, during testing, utilizing at least some of the driver lines from the test device to the circuit devices jointly and substantially simultaneously for all the circuit devices, and reading one of test result information items and data from the input/output line devices of the semiconductor circuit devices to be tested to the test device in compressed form.

In the case of the method according to the invention for testing semiconductor circuit devices, in particular, semiconductor memories or the like, preferably DRAMs, a plurality of substantially identically acting or identical semiconductor circuit devices are provided. At least one test of a plurality of semiconductor circuit devices is carried out in parallel and substantially simultaneously. Furthermore, according to the invention, at least some of driver lines—used during the testing—from a test device to the semiconductor circuit devices are respectively used jointly and substantially simultaneously for all the semiconductor circuit devices.

In accordance with another mode of the invention, in a first alternative of the method according to the invention for testing semiconductor circuit devices, test result information items or test result data are read from a plurality of input/output channels or input/output line devices of the semiconductor circuit devices to be tested in compressed form, in particular, to the test device. It is, thus, a fundamental idea of the first alternative of the method to use, instead of the full number of existing input/output channels, the test result information items or data that are to be read therefrom, and are to be evaluated, in compressed form. As a result, the data outlay to be evaluated can be reduced and, consequently, the test speed and also the number of semiconductor circuit devices to be tested can be increased.

In accordance with a further mode of the invention, the in accordance with a second alternative according to the invention, the plurality of semiconductor circuit devices to be tested are disposed and tested in a configuration with at least one stack of semiconductor circuit devices that are substantially disposed one above the other and interconnected in accordance with the at least one test. It is, thus, a fundamental idea of the second alternative to dispose semiconductor circuit devices to be tested, which, after all, are constructed in an substantially identically acting or identical manner, in spatially compact form, to feed them to the test and, thus, to create the possibility of simultaneously testing a particularly large number of semiconductor circuit devices to be tested on a particularly small test area.

Compared with the conventional procedure of straightforward parallel testing, the proposed solution alternatives have advantages with regard to the test throughput and the equipment and organizational outlay for the tests to be carried out. Both measures make it possible, in a particularly simple manner, that is to say, with particularly low management and equipment outlay, nevertheless, to reliably check and test a particularly large number of semiconductor circuit devices.

The combination of the features of the two alternative methods according to the invention for testing semiconductor circuit devices is particularly advantageous. This yields the advantages from the combination and the interaction of the individual measures, namely, from the parallel operation of the tests on a plurality of semiconductor circuit devices, from the common wiring of the semiconductor circuit devices to be tested through common and simultaneously used driver lines, in particular, with regard to all identical address terminals and/or command terminals, from carrying out a compression with regard to the plurality of input/output channels or line devices of the semiconductor circuit devices and the respective test result information items or data, and also from the additional or alternative configuration of the semiconductor circuit devices to be tested one above the other in a magazine or a stack.

In accordance with an added mode of the invention, the compression is substantially carried out in the region of the semiconductor circuit devices to be tested themselves. Such a process can be realized, for example, also by a software realization in the semiconductor circuit device to be tested.

In accordance with an additional mode of the invention, the compression of the test result information items or test result data is substantially carried out by hardware.

In such a case, it is particularly advantageous if a compression circuit is provided and used for the compression, in particular, if appropriate, in each case a compression circuit in the region of a semiconductor circuit device to be tested or as part thereof. It is conceivable, for example, that, in response to the feeding of specific commands, the actual output is not conducted directly to the input/output channels or line devices, but, rather, is output through a corresponding intermediate stage, namely, of the compression circuit, in compressed form.

In accordance with yet another mode of the invention, the compression, for each of the semiconductor circuit devices to be tested, is effected to a number m of test output channels, which is less than the number n of input/output channels or input/output line devices of the semiconductor circuit devices to be tested so that the relationship m<n holds true. What is achieved thereby is that the volume of the test result information items or test result data that are present on the total number n of input/output channels is reduced to a smaller number m of test output channels.

In such a case, it is particularly advantageous if the compression is in each case effected to a single test output channel for each semiconductor circuit device to be tested. In this case, it is possible, for example, to realize, if appropriate, a multiple OR combination of the input/output channels or input/output line devices of the individual semiconductor circuit devices and/or, in particular, as binary pass/fail information for each individual semiconductor circuit device.

In accordance with yet a further mode of the invention, for independent evaluation of the tests carried out for each individual semiconductor circuit device to be tested, the test output channels of the semiconductor circuit devices to be tested are read separately, but, in particular, substantially simultaneously.

In accordance with yet an added mode of the invention, the compression is respectively carried out to a single test output channel by a multiple OR combination of one of the respective input/output channels and the respective input/output line devices of the individual circuit devices and/or as binary pass/fail information for each individual one of the circuit devices.

In accordance with yet an additional mode of the invention, mutually corresponding or identical address terminals and/or command terminals of the semiconductor circuit devices to be tested—in particular, of a respective stack—are in each case jointly contact-connected with a corresponding common address line and/or command line of the driver line devices of the test device. Such connection reduces the circuitry outlay for carrying out in parallel the tests that are to be carried out, because the individual mutually corresponding terminals can respectively be looped through by a single line.

The test efficiency and the test throughput can be increased further if, in accordance with again another mode of the invention, a plurality of stacks are provided and are substantially tested simultaneously and in parallel.

For the comparability of the test results of the semiconductor circuit devices that are tested simultaneously or in parallel, it is necessary to comply with certain boundary conditions with regard to the signal quality and the signal propagation times. Therefore, in accordance with another embodiment of the methods according to the invention, driver lines to the individual stacks and/or to the individual semiconductor circuit devices to be tested of approximately the same length are provided to adapt and to improve the signal quality and the signal propagation time behavior. Such a configuration is concomitantly realized, in particular, by the stack configuration of the semiconductor circuit devices.

A further measure for improving and adapting the signal quality and/or the signal propagation time lies in providing and using driver lines with a terminating resistor.

With the objects of the invention in view, there is also provided a method for testing semiconductor circuit devices, including the steps of providing a plurality of semiconductor circuit devices having a plurality of input/output line devices and driver lines, the circuit devices one of acting substantially identically and being identical, providing a test device for testing the circuit devices, carrying out at least one test on the circuit devices in parallel and substantially simultaneously, during testing, utilizing at least some of the driver lines from the test device to the circuit devices jointly and substantially simultaneously for all the circuit devices, and placing and testing the circuit devices to be tested in at least one circuit device stack having the circuit devices substantially disposed one above another and interconnected in accordance with the at least one test.

These and further aspects of the present invention are explained in more detail through the following remarks.

A considerable proportion of the fabrication costs, e.g., in the case of DRAMs is determined by functional tests. DRAM products are tested at the wafer level, in device form and as modules, to guarantee undisturbed operation—according to the data sheet—to the end user. In the case of a 128 Mbit DRAM memory, the proportion of the fabrication costs incurred for tests amounts to approximately 15–20% of the total costs.

With increasing memory depth of future DRAM generations (256M, 512M, 1G, . . . ), the test times will rise proportionally according to the memory depth. The consequence of such an increase is that the costs for tests will make up an ever-larger proportion of the manufacturing costs. The longer test times have also increased the manufacturing turnaround times. In other words, the products will reach the customer later.

The invention makes it possible to test semiconductor circuit devices, e.g., memory products, with significantly shorter measurement times per Mbit—for the same test scope. As a result, it is possible to realize significant cost advantages and a reduction of the turnaround times in the fabrication of, in particular, DRAM memory products.

A lengthening of the test time in the case of a DRAM generation change has hitherto been compensated for, inter alia, by test modes such as, inter alia, writing to or reading from four banks in parallel. However, such a process is generally associated with an additional design outlay and a new layout. A further problem of such a procedure is that additional space is required on the module.

Based on an input/output or I/O compression circuit that outputs a pass/fail information item on an I/O channel, the possibility exists of stacking modules one above the other. Through a corresponding wiring of the I/Os by mechanical contact-connection (I/O1—plane 1, tester channel 1; I/O2—plane 2, tester channel 2, etc.) and the wiring of all identical address and command pins together (all Adr0 pins, all ADR1 pins, . . . ) it is possible to increase the parallelism without impairing the pass/fail decision. The signal performance can also be better adapted by corresponding terminating resistors at the end of the wiring/printed circuit board.

The basic ideas of the invention are, thus, the utilization of an I/O compression circuit in combination with the stacking of the components in the third dimension with corresponding wiring and/or printed circuit board, in order to obtain a higher throughput during testing.

Other features that are considered as characteristic for the invention are set forth in the appended claims.

Although the invention is illustrated and described herein as embodied in a method for testing semiconductor circuit devices, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 3 is a block circuit diagram of an alternative embodiment of a stack of semiconductor circuit devices of FIG. 1 to be tested and a corresponding contact-connecting scheme.

DESCRIPTION OF THE PREFERRED EMBODIMENTS

The diagrammatic illustrations below elucidate configuration of semiconductor circuit devices 10 as can be used in the implementation of the methods for testing according to the invention. In this case, identical reference symbols also designate identical elements and functional constituents, without repeating in detail the description thereof on every occurrence.

Figure 1:
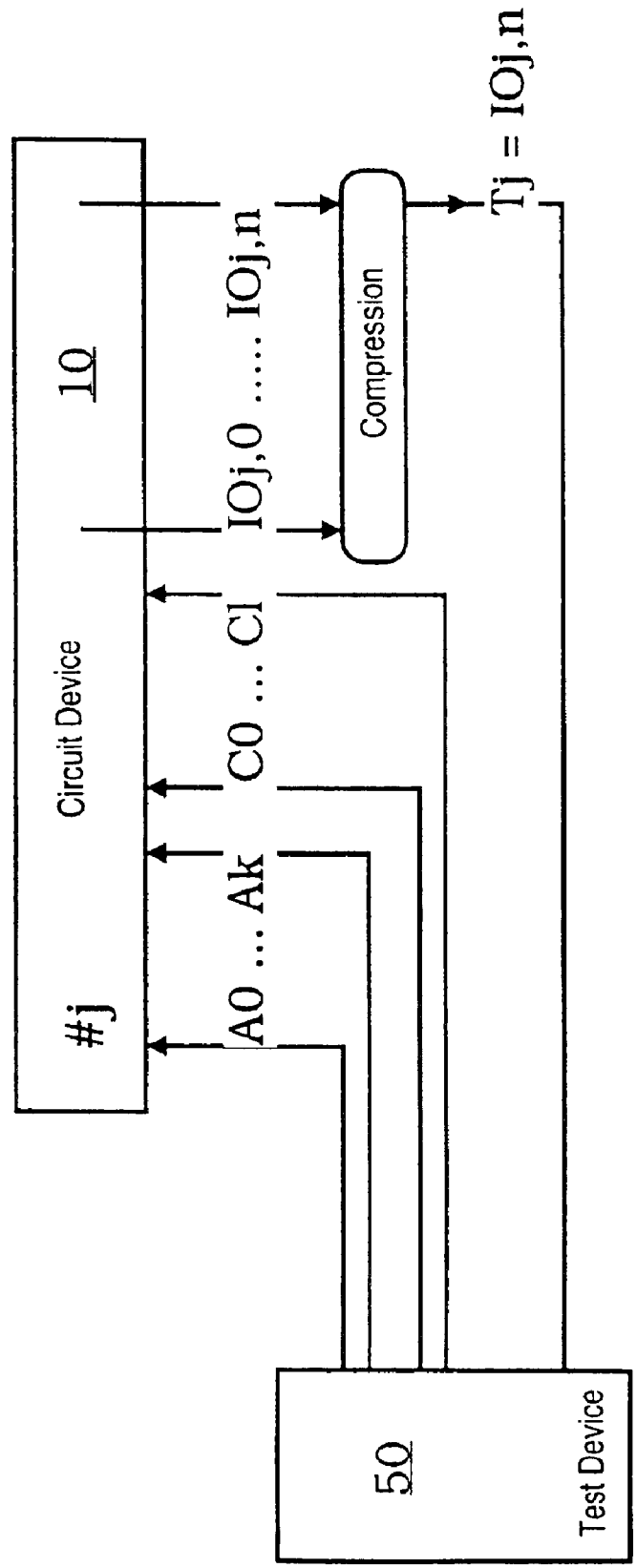
FIG. 1 is a block circuit diagram of an edge region of a semiconductor circuit device used in the test method according to the invention.

Referring now to the figures of the drawings in detail and first, particularly to FIG. 1 thereof, there is shown a diagrammatic illustration of a semiconductor circuit device 10 to be tested, to be precise, looking at an edge region from which originate address terminals A0 to Ak, command terminals C0 to C1, and also input/output terminals or channels IOj,1 to IOj,n for the jth semiconductor circuit device 10 to be tested.

When carrying out the test methods according to the invention, corresponding address data and command data are transmitted through the address terminals A0 to Ak and also through the command terminals C0 to C1 of the semiconductor circuit device 10 to be tested from a test device 50 that is provided, identically designated respective driver line devices A0 to Ak, C0 to C1 being provided with the terminals.

As a test result, n primary test result information items or data correspondingly appear at the input/output terminals or channels IOj,0 to IOj,n in the case of the conventional procedure.

However, a test result data compression is now interposed according to the invention, which compression—in the case of the procedure illustrated in FIG. 1—combines the totality of the input/output channels IOj,0 to IOj,n to a test output channel Tj for the jth semiconductor component 10, j=0, . . . , N to be tested.

Figure 2:
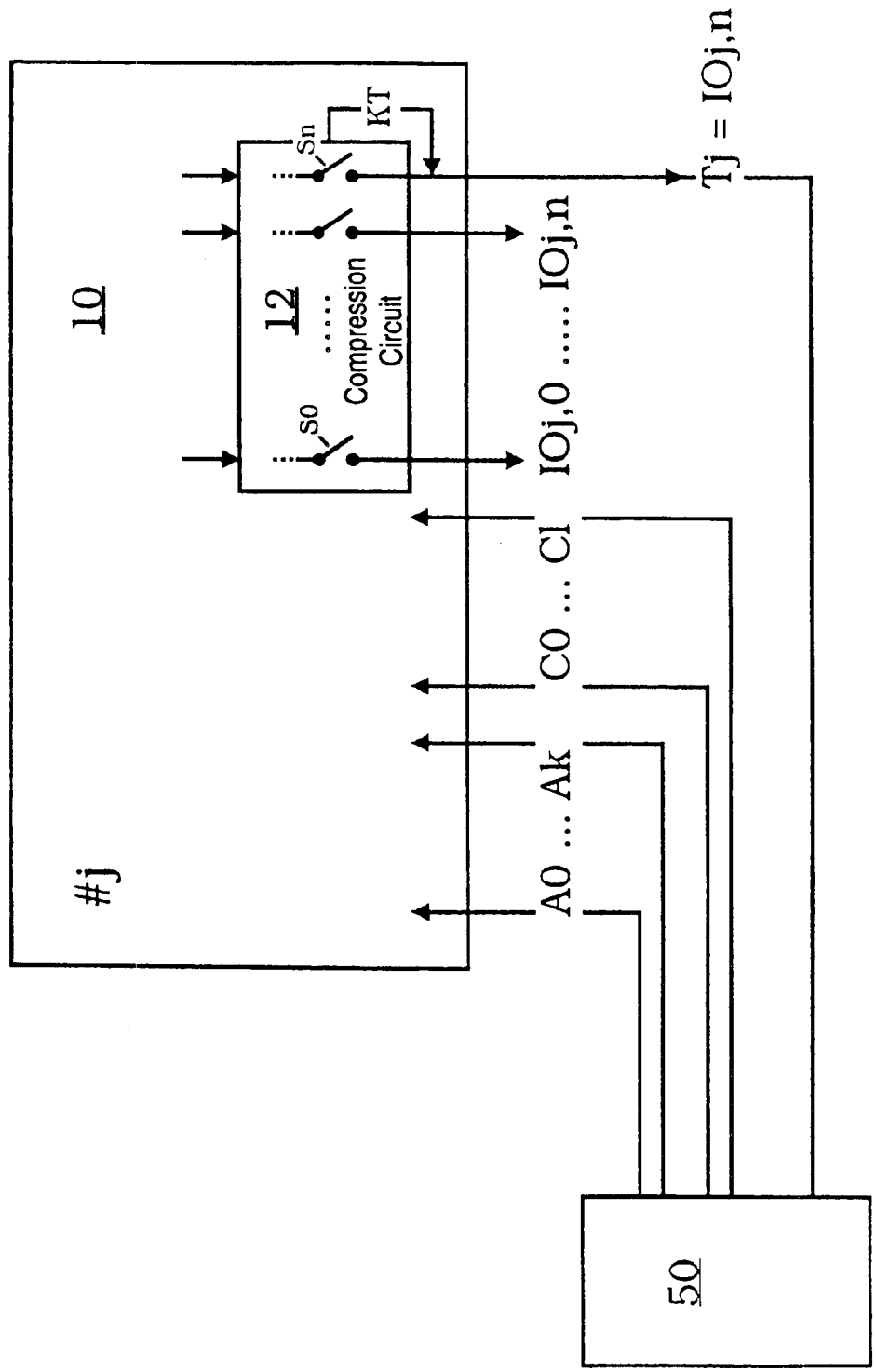
FIG. 2 is a block circuit diagram of an embodiment of the edge region of a semiconductor circuit device of FIG. 1.

FIG. 2 shows the situation depicted in FIG. 1, once again in diagrammatic plan view, where it becomes clear that the compression method is realized by hardware by providing a compression circuit 12 in the region of the semiconductor circuit device 10 to be tested or as a part thereof.

The direct outputting of the primary test result data or primary test result functions to the input/output terminals IOj,0 to IOj,n is interrupted by the interruption at the switch devices S0 to Sn of the compression circuit 12. Rather, the compressed test result data KT are output to a selected input/output terminal, namely, here, the most significant IOj,n, the latter, thus, serving as test output channel Tj for the jth component 10 to be tested.

FIG. 3 shows, in a diagrammatic side view, a stack 100—used according to the invention—of a number N+1, namely for j=0, . . . , N, of semiconductor circuit devices 10 to be tested simultaneously using a common test device 50. It becomes clear that all mutually corresponding or identical address terminals A0 to Ak and command terminals C0 to C1 are respectively looped through for all the semiconductor circuit devices 10 of the stack 100 that are to be tested, and are connected to the test device 50 by a single and common line device or driver line. In contrast thereto, the separately present test output terminals T1 to TN, which are actually the most significant input/output terminals or channels IO1,n to ION,n, remain separate from one another and are also read and analyzed separately.

We claim:

1. A method for testing semiconductor circuit devices, which comprises:
   providing a plurality of semiconductor circuit devices having a plurality of input/output line devices and driver lines, the circuit devices one of:
     acting substantially identically; and
     being identical;
   providing a test device for testing the circuit devices;
   carrying out at least one test on the circuit devices in parallel and substantially simultaneously;
   during testing, utilizing at least some of the driver lines from the test device to the circuit devices jointly and substantially simultaneously for all the circuit devices;
   reading one of test result information items and data from the input/output line devices of the semiconductor circuit devices to be tested to the test device in compressed form; and
   placing and testing the circuit devices to be tested in at least one circuit device stack having the circuit devices substantially disposed one above another and interconnected in accordance with the at least one test.

2. The method according to claim 1, wherein the circuit devices are semiconductor memories.

3. The method according to claim 2, wherein the semiconductor memories are DRAMs.

4. The method according to claim 1, which further comprises carrying out the compression substantially in a region of the circuit devices to be tested.

5. The method according to claim 1, which further comprises respectively jointly contact-connecting at least one of:
   one of mutually corresponding and identical address terminals of a respective stack to be tested; and
   one of mutually corresponding and identical command terminals of a respective stack to be tested;
with at least one of:
   a corresponding common address line of the driver lines of the test device; and
   a corresponding common command line of the driver lines of the test device.

6. The method according to claim 1, which further comprises carrying out the compression, for each of the circuit devices to be tested, to a number m of test output channels being less than a number n of one of:
   input/output channels; and
   the input/output line devices.

7. The method according to claim 6, which further comprises respectively carrying out the compression to a single test output channel.

8. The method according to claim 6, which further comprises respectively carrying out the compression to a single test output channel by at least one of:
 a multiple OR combination of one of the respective input/output channels and the respective input/output line devices of the individual circuit devices; and
 as binary pass/fail information for each individual one of the circuit devices.

9. The method according to claim 6, which further comprises reading the test output channels of the circuit devices to be tested separately.

10. The method according to claim 9, which further comprises reading the test output channels of the circuit devices to be tested substantially simultaneously.

11. A method for testing semiconductor circuit devices, which comprises:
 providing a plurality of semiconductor circuit devices having a plurality of input/output line devices and driver lines, the circuit devices one of:
  acting substantially identically; and
  being identical;
 providing a test device for testing the circuit devices;
 carrying out at least one test on the circuit devices in parallel and substantially simultaneously;
 during testing, utilizing at least some of the driver lines from the test device to the circuit devices jointly and substantially simultaneously for all the circuit devices;
 reading one of test result information items and data from the input/output line devices of the semiconductor circuit devices to be tested to the test device in compressed form; and
 providing a plurality of stacks and testing the stacks substantially simultaneously and in parallel.

12. The method according to claim 11, which further comprises sizing the driver lines to at least one of the individual stacks and the circuit devices to be tested with substantially the same length and, thereby, improving a signal quality and a signal propagation time behavior with the driver lines.

13. The method according to claim 11, which further comprises, improving a signal quality and a signal propagation time behavior by sizing the driver lines to one of the individual stacks and the circuit devices to be tested with substantially the same length.

14. The method according to claim 11, which further comprises connecting a terminating resistor to the driver lines to improve signal quality and signal propagation time behavior.

15. The method according to claim 11, which further comprises improving signal quality and signal propagation time behavior by connecting a terminating resistor to the driver lines.

16. A method for testing semiconductor circuit devices, which comprises:
 providing a plurality of semiconductor circuit devices having a plurality of input/output line devices and driver lines, the circuit devices one of:
  acting substantially identically; and
  being identical;
 providing a test device for testing the circuit devices;
 carrying out at least one test on the circuit devices in parallel and substantially simultaneously;
 during testing, utilizing at least some of the driver lines from the test device to the circuit devices jointly and substantially simultaneously for all the circuit devices; and
 placing and testing the circuit devices to be tested in at least one circuit device stack having the circuit devices substantially disposed one above another and interconnected in accordance with the at least one test.

17. The method according to claim 16, wherein the circuit devices are semiconductor memories.

18. The method according to claim 16, wherein the semiconductor memories are DRAMs.

19. The method according to claim 16, which further comprises respectively jointly contact-connecting at least one of:
 one of mutually corresponding and identical address terminals of the circuit device to be tested; and
 one of mutually corresponding and identical command terminals of the circuit device to be tested;
with at least one of:
 a corresponding common address line of the driver lines of the test device; and
 a corresponding common command line of the driver lines of the test device.

20. The method according to claim 16, which further comprises respectively jointly contact-connecting at least one of:
 one of mutually corresponding and identical address terminals of a respective stack to be tested; and
 one of mutually corresponding and identical command terminals of a respective stack to be tested;
with at least one of:
 a corresponding common address line of the driver lines of the test device; and
 a corresponding common command line of the driver lines of the test device.

21. The method according to claim 16, which further comprises providing a plurality of stacks and testing the stacks substantially simultaneously and in parallel.

22. The method according to claim 21, which further comprises sizing the driver lines to at least one of the individual stacks and the circuit devices to be tested with substantially the same length and, thereby, improving a signal quality and a signal propagation time behavior with the driver lines.

23. The method according to claim 21, which further comprises improving a signal quality and a signal propagation time behavior by sizing the driver lines to one of the individual stacks and the circuit devices to be tested with substantially the same length.

24. The method according to claim 21, which further comprises connecting a terminating resistor to the driver lines to improve signal quality and signal propagation time behavior.

25. The method according to claim 21, which further comprises improving signal quality and signal propagation time behavior by connecting a terminating resistor to the driver lines.

26. The method according to claim 16, which further comprises reading one of test result information items and data from the input/output line devices of the semiconductor circuit devices to be tested to the test device in compressed form.

27. The method according to claim 26, which further comprises carrying out the compression substantially in a region of the circuit devices to be tested.

28. The method according to claim 26, which further comprises substantially carrying out the compression with hardware.

29. The method according to claim 28, which further comprises carrying out the compression with a compression circuit.

30. The method according to claim 28, which further comprises carrying out the compression with a compression circuit being one of:
  in a respective region of each of the circuit devices; and
  part of each of the circuit devices.

31. The method according to claim 26, which further comprises carrying out the compression, for each of the circuit devices to be tested, to a number m of test output channels being less than a number n of one of:
  input/output channels; and
  the input/output line devices.

32. The method according to claim 31, which further comprises respectively carrying out the compression to a single test output channel.

33. The method according to claim 31, which further comprises respectively carrying out the compression to a single test output channel by at least one of:
  a multiple OR combination of one of the respective input/output channels and the respective input/output line devices of the individual circuit devices; and
  as binary pass/fail information for each individual one of the circuit devices.

34. The method according to claim 31, which further comprises reading the test output channels of the circuit devices to be tested separately.

35. The method according to claim 34, which further comprises reading the test output channels of the circuit devices to be tested substantially simultaneously.

36. A method for testing semiconductor circuit devices, which comprises:
  providing a plurality of semiconductor circuit devices having a plurality of input/output line devices and driver lines, the circuit devices one of:
    acting substantially identically; and
    being identical;
  providing a test device for testing the circuit devices;
  carrying out at least one test on the circuit devices in parallel and substantially simultaneously;
  during testing, utilizing at least some of the driver lines from the test device to the circuit devices jointly and substantially simultaneously for all the circuit devices;
  reading one of test result information items and data from the input/output line devices of the semiconductor circuit devices to be tested to the test device in compressed form; and
  substantially carrying out the compression with hardware by carrying out the compression with a compression circuit.

37. A method for testing semiconductor circuit devices, which comprises:
  providing a plurality of semiconductor circuit devices having a plurality of input/output line devices and driver lines, the circuit devices one of:
    acting substantially identically; and
    being identical;
  providing a test device for testing the circuit devices;
  carrying out at least one test on the circuit devices in parallel and substantially simultaneously;
  during testing, utilizing at least some of the driver lines from the test device to the circuit devices jointly and substantially simultaneously for all the circuit devices;
  reading one of test result information items and data from the input/output line devices of the semiconductor circuit devices to be tested to the test device in compressed form; and
  substantially carrying out the compression with hardware by carrying out the compression with a compression circuit being one of:
  in a respective region of each of the circuit devices; and
  part of each of the circuit devices.

38. A method for testing semiconductor circuit devices, which comprises:
  providing a plurality of semiconductor circuit devices having a plurality of input/output line devices and driver lines, the circuit devices one of:
    acting substantially identically; and
    being identical;
  providing a test device for testing the circuit devices;
  carrying out at least one test on the circuit devices in parallel and substantially simultaneously;
  during testing, utilizing at least some of the driver lines from the test device to the circuit devices jointly and substantially simultaneously for all the circuit devices;
  reading one of test result information items and data from the input/output line devices of the semiconductor circuit devices to be tested to the test device in compressed form; and
  respectively jointly contact-connecting at least one of:
    one of mutually corresponding and identical address terminals of the circuit device to be tested; and
    one of mutually corresponding and identical command terminals of the circuit device to be tested;
  with at least one of:
    a corresponding common address line of the driver lines of the test device; and
    a corresponding common command line of the driver lines of the test device.

* * * * *